(12) United States Patent
Wang

(10) Patent No.: US 9,508,933 B2
(45) Date of Patent: Nov. 29, 2016

(54) ORGANIC LIGHT-EMITTING DIODE (OLED) DEVICE, MANUFACTURING METHOD THEREOF AND DISPLAY DEVICE

(71) Applicant: BOE TECHNOLOGY GROUP CO., LTD., Beijing (CN)

(72) Inventor: Huifeng Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/768,524

(22) PCT Filed: Dec. 17, 2014

(86) PCT No.: PCT/CN2014/094078
§ 371 (c)(1),
(2) Date: Aug. 18, 2015

(87) PCT Pub. No.: WO2016/041280
PCT Pub. Date: Mar. 24, 2016

(65) Prior Publication Data
US 2016/0254455 A1    Sep. 1, 2016

(30) Foreign Application Priority Data
Sep. 15, 2014  (CN) .......................... 2014 1 0469986

(51) Int. Cl.
*H01L 21/00* (2006.01)
*H01L 51/00* (2006.01)
(Continued)

(52) U.S. Cl.
CPC ....... *H01L 51/0029* (2013.01); *H01L 27/3246* (2013.01); *H01L 51/5218* (2013.01);
(Continued)

(58) Field of Classification Search
CPC ........... H01L 51/0029; H01L 51/5228; H01L 51/56; H01L 51/5218; H01L 51/5234; H01L 27/3246; H01L 2227/323; H01L 2251/558; H01L 2251/5315
See application file for complete search history.

(56) References Cited

U.S. PATENT DOCUMENTS 6,521,511 B1    2/2003  Inoue et al.
9,365,767 B2 *  6/2016  Yabe ...................... C09K 11/06
(Continued)

FOREIGN PATENT DOCUMENTS

CN    1628482 A    6/2005
CN    1628492 A    6/2005
(Continued)

OTHER PUBLICATIONS

International Search Report of PCT/CN2014/094078 in Chinese, mailed Jun. 10, 2015 with English translation.
(Continued)

*Primary Examiner* — Reema Patel
*Assistant Examiner* — Syed Gheyas
(74) *Attorney, Agent, or Firm* — Collard & Roe, P.C.

(57) ABSTRACT

A method for manufacturing an organic light-emitting diode (OLED) device includes: forming auxiliary electrodes (2) on a resin layer (1) of an OLED substrate; forming a gas generation layer (4) on the auxiliary electrodes (2); forming an organic light-emitting layer (6) on the gas generation layer (4); placing a receptor substrate (12) on the organic light-emitting layer (6) and scanning auxiliary electrode regions (22) by laser, so that the gas generation layer (4) is decomposed under laser irradiation to release gas, and hence the organic light-emitting layer (6) in the auxiliary electrode regions (22) is transferred to the receptor substrate (12); removing the receptor substrate (12); and forming a cathode (7) on the auxiliary electrodes. The manufacturing process can effectively reduce poor contact between the auxiliary electrodes and the cathode.

20 Claims, 2 Drawing Sheets

(51) Int. Cl.
*H01L 51/56* (2006.01)
*H01L 51/52* (2006.01)
*H01L 27/32* (2006.01)

(52) U.S. Cl.
CPC ....... *H01L51/5228* (2013.01); *H01L 51/5234* (2013.01); *H01L 51/56* (2013.01); *H01L 2227/323* (2013.01); *H01L 2251/5315* (2013.01); *H01L 2251/558* (2013.01)

(56) References Cited

U.S. PATENT DOCUMENTS

| | | | | |
|---|---|---|---|---|
| 2003/0006699 | A1* | 1/2003 | Ogino | H01L 27/3211 313/506 |
| 2003/0197466 | A1* | 10/2003 | Yamazaki | H01L 27/3246 313/504 |
| 2005/0012094 | A1 | 1/2005 | Park | |
| 2005/0116620 | A1* | 6/2005 | Kobayashi | H01L 51/5271 313/503 |
| 2005/0179374 | A1* | 8/2005 | Kwak | H01L 27/3276 313/506 |
| 2006/0043889 | A1* | 3/2006 | Kim | B41M 5/265 313/506 |
| 2007/0082288 | A1* | 4/2007 | Wright | B41M 5/46 430/200 |
| 2008/0048562 | A1* | 2/2008 | Matsuda | H01L 27/3244 313/506 |
| 2012/0099615 | A1 | 4/2012 | Sun et al. | |
| 2014/0008657 | A1 | 1/2014 | Lu et al. | |
| 2014/0099738 | A1 | 4/2014 | Lee et al. | |
| 2015/0243934 | A1* | 8/2015 | Han | H01L 51/56 438/34 |
| 2016/0039182 | A1 | 2/2016 | Wang | |

FOREIGN PATENT DOCUMENTS

| | | |
|---|---|---|
| CN | 101968948 A | 2/2011 |
| CN | 202917543 U | 5/2013 |
| CN | 103700662 A | 4/2014 |
| CN | 102769109 A | 4/2016 |
| JP | 2001-051296 A | 2/2001 |
| WO | 03/067918 A1 | 8/2003 |

OTHER PUBLICATIONS

Notice of Transmittal of the International Search Report of PCT/CN2014/094078 in Chinese, mailed Jun. 10, 2015.
Written Opinion of the International Searching Authority of PCT/CN2014/094078 in Chinese, mailed Jun. 10, 2015 with English translation.
Chinese Office Action in Chinese Application No. 201410469986.7, mailed Apr. 22, 2016 with English translation.
Second Chinese Office Action in Chinese Application No. 201410469986.7, mailed Jul. 6, 2016 with English translation.

* cited by examiner

ORGANIC LIGHT-EMITTING DIODE (OLED) DEVICE, MANUFACTURING METHOD THEREOF AND DISPLAY DEVICE

CROSS REFERENCE TO RELATED APPLICATIONS

This application is the National Stage of PCT/CN2014/094078 filed on Dec. 17, 2014, which claims priority under 35 U.S.C. §119 of Chinese Application No. 201410469986.7 filed on Sep. 15, 2014, the disclosure of which is incorporated by reference.

TECHNICAL FIELD

Embodiments of the present invention relate to an organic light-emitting diode (OLED) device, a manufacturing method thereof and a display device.

BACKGROUND

Compared with liquid crystal displays (LCDs), OLED devices have the advantages of self-luminous property, rapid response speed, wide viewing angle, high brightness, rich color, light weight, low thickness, etc. An OLED device generally includes an anode layer, an emission layer (EML) and a cathode layer and can be divided into a bottom-emission type and a top-emission type according to different configuration of light-emitting surfaces. Top-emission devices have become research focus in recent years as larger aperture ratio can be obtained. A top-emission OLED requires a thin cathode and a reflecting anode to increase the light transmittance, and the thin transparent cathode has large sheet resistance and notable IR drop. Generally, the IR drop of a light-emitting surface of the OLED farther away from a power supply place is more obvious, and hence the OLED device has obvious phenomenon of uneven luminescence.

In order to alleviate the uneven brightness phenomenon of devices, many proposals are presented. In most proposals, auxiliary electrodes that are communicated with the transparent cathode and are connected with each other are additionally provided. The auxiliary electrode may be generally formed of a metal with small electric resistivity, and has a large thickness, sheet resistance of about 1Ω, and reduced IR drop. Therefore, when a power source is applied, the IR drop running through a cathode of the panel is small, and hence the brightness uniformity can be alleviated.

Because the auxiliary electrodes are opaque and light cannot pass through the auxiliary electrodes, the additionally arranged auxiliary electrodes cannot be placed over the EML. Two solutions, namely upper auxiliary electrodes and lower auxiliary electrodes, may be provided according to the fact that the auxiliary electrodes are formed on an array substrate (array backplane) or a color filter (CF) substrate (CF backplane).

As for the upper auxiliary electrode solution, a CF substrate and an OLED substrate are cell-assembled together by means of vacuum pressing, and a conductive layer on spacers makes contact with a cathode under pressure and is deformed. Thus, there are invoked two problems: 1. The deformation of the spacers may result in the breakage of the conductive layer, and the connection between the auxiliary electrodes and the cathode may be broken, so that the pressing strength must be accurately controlled; and 2. Because the contact between the conductive layer on the spacer and the cathode is surface contact, poor contact can be produced.

As for the lower auxiliary electrode solution, in order to avoid the poor contact between the auxiliary electrodes and the cathode, the auxiliary electrodes are formed in non-luminous regions on the cathode. Thus, there is invoked one problem: the positioning accuracy requirement of the auxiliary electrodes can be easily satisfied by the traditional exposure process, but OLED materials are very sensitive to moisture and water vapor and the thin-film transistor (TFT) etching process is incompatible. In another aspect, the thin cathode metal can be also easily over-etched. When the auxiliary electrodes are formed by fine metal mask (FMM) evaporation, as for small-size panels, the auxiliary electrodes can be easily obtained by evaporation, but the problem of long evaporation time can be caused because the auxiliary electrodes are generally thick. What is worse, when the size of the panel is increased, the correspondingly required FMM is larger, and hence the alignment problem can be caused by the gravity effect to the mask.

SUMMARY

At least one embodiment of the present invention provides a method for manufacturing an OLED device, which comprises: forming auxiliary electrodes on a resin layer of an OLED substrate; forming a gas generation layer on the auxiliary electrodes; forming an organic light-emitting layer on the gas generation layer; placing a receptor substrate on the organic light-emitting layer and scanning auxiliary electrode regions by laser, so that the gas generation layer is decomposed under laser irradiation to release gas, and hence the organic light-emitting layer in the auxiliary electrode regions is transferred to the receptor substrate; removing the receptor substrate; and forming a cathode on the auxiliary electrodes.

For instance, the gas generation layer is made of a material capable of releasing gas under laser excitation.

For instance, the material of the gas generation layer may comprise gallium nitride (GaN), aluminum nitride (AlN), pentaerythritol tetranitrate (PETN) or trinitrotoluene (TNT).

For instance, the thickness of the gas generation layer may be from 10 nm to 100 μm. For instance, the thickness of the gas generation layer may be from 200 to 500 nm.

For instance, a photothermal conversion layer may be formed between the auxiliary electrodes and the gas generation layer and may be formed of a light-absorbing material.

For instance, the light-absorbing material may be an organic film, a metal oxide, a metal sulfide or any composition thereof.

For instance, a buffer layer may be formed between the gas generation layer and the organic light-emitting layer and is configured to control the adhesion between the gas generation layer and the organic light-emitting layer.

For instance, the buffer layer may be formed of an organic matter or a metal oxide.

For instance, an anode is formed on the resin layer and a pixel define layer (PDL) structure provided with pixel regions and the auxiliary electrode regions is formed.

For instance, the PDL structure is formed before the auxiliary electrodes are formed, or the PDL structure is formed after the auxiliary electrodes are formed.

For instance, the organic light-emitting layer is formed on the anode and the PDL structure and at the same time the organic light-emitting layer is formed on the gas generation layer.

For instance, before the auxiliary electrodes, the anode and the PDL structure are formed, the method may further comprise: forming a gate electrode layer, a gate insulating layer, active layers, an etch barrier layer, a passivation layer and the resin layer on a glass substrate.

For instance, the cathode may be formed on the organic light-emitting layer and at the same time the cathode is formed on the auxiliary electrodes.

An embodiment of the present invention further provides an OLED device, which is manufactured by any foregoing method.

An embodiment of the present invention further provides a display device, which comprises the foregoing OLED device.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

REFERENCE NUMERALS

Figure 1:
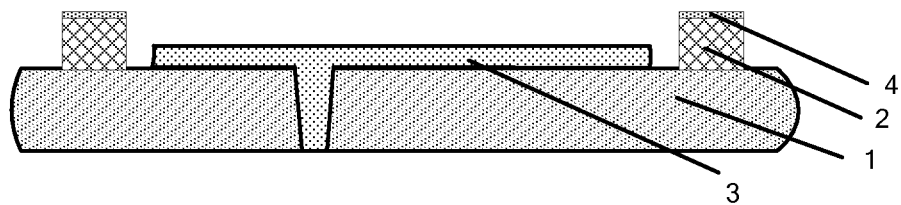
FIG. 1 is a schematic structural view illustrating the step of forming auxiliary electrodes in a method for manufacturing an OLED device, provided by an embodiment of the present invention.

1—Resin Layer; 2—Auxiliary Electrode; 3—Anode; 4—Gas generation layer; 5—PDL Structure; 6—OLED Layer; 7—Cathode (Transparent Electrode); 8—Planarization Layer; 9—CF Layer; 10—Black Matrix (BM); 11—Glass Substrate; 12—Receptor Substrate; 20—Photothermal conversion Layer; 21—Buffer Layer; 22—Auxiliary Electrode Region.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

In order to overcome the defects mentioned in the background, the following proposal is adopted: auxiliary electrodes are formed on an array substrate; subsequently, auxiliary electrode regions are irradiated by laser after an organic light-emitting layer is formed; a Photothermal conversion layer coated on an auxiliary electrode layer is heated, and the organic light-emitting layer is melted accordingly, so that the organic light-emitting layer is stripped off; and subsequently, transparent electrodes are evaporated to achieve the conduction between the auxiliary electrodes and the OLED transparent electrodes. But in the proposal, the carbonization product of the organic light-emitting layer under laser irradiation tends to be transferred to luminous regions in the subsequent process, and hence pixel defects can be caused.

The technical problem to be solved in the embodiment of the present invention involves how to adopt a new process for forming auxiliary electrodes to overcome the defects in pixel regions and hence improve the display quality of luminescent devices.

As illustrated in FIGS. 1 to 6, the first embodiment of the present invention provides a method for manufacturing an OLED device, which comprises the following steps:

S1: forming auxiliary electrodes 2 on a resin layer 1 of an OLED substrate;

S2: forming a gas generation layer 4 on the auxiliary electrodes 2;

S3: forming an organic light-emitting layer 6 on the gas generation layer 4;

S4: placing a receptor substrate 12 on the organic light-emitting layer 6 and scanning auxiliary electrode regions 22 by laser, so that the gas generation layer 4 is decomposed under laser irradiation to release gas, and hence the organic light-emitting layer 6 in the auxiliary electrode regions 22 is transferred to the receptor substrate 12;

S5: removing the receptor substrate 12; and

S6: forming a cathode 7 on the auxiliary electrodes 2.

For instance, the auxiliary electrode 2 is preferably made of a metal with the electric resistivity of less than $10 \times 10^{-8}$ $\Omega \cdot m$, e.g., silver, copper, aluminum, molybdenum or any alloy thereof. The thickness of the metal may be from 100 nm to 1,000 nm. The metal wiring may be in a reticular structure and may also be strip-shaped.

The gas generation layer is made from a material capable of releasing gas under the excitation of laser with specific energy. The thickness may be from 10 nm to 100 μm, preferably from 200 to 500 nm. The material has small energy band gap, for instance, may adopt a material that is easy to absorb the energy of ultraviolet laser. The optional material for the gas generation layer such as GaN (with the band gap of 3.3 eV) and MN (with the band gap of 6.3 eV) may be decomposed under laser irradiation to produce $N_2$ and corresponding metal. In addition, the optional material of the gas generation layer may also be PETN, TNT or the like, which may be decomposed under laser irradiation to produce $N_2$. The gas generation material may be one of the aforesaid materials for producing gas or a mixture of materials for producing gas, or the gas generation material is mixed with other photothermal conversion material(s).

The stripping principle is that: laser is radiated to the gas generation layer through a base; the material of the gas generation layer absorbs a large amount of laser energy, so that the temperature of the material rises to produce gas due to thermal decomposition, and hence the gas generation layer can be separated from the auxiliary electrodes. Therefore, an appropriate receptor substrate is placed on the organic light-emitting layer, and subsequently, the auxiliary electrode regions are scanned by laser, so that the gas generation layer is decomposed under laser irradiation to release gas, and hence the organic light-emitting layer in the auxiliary electrode regions is transferred to the receptor substrate.

Figure 3A:
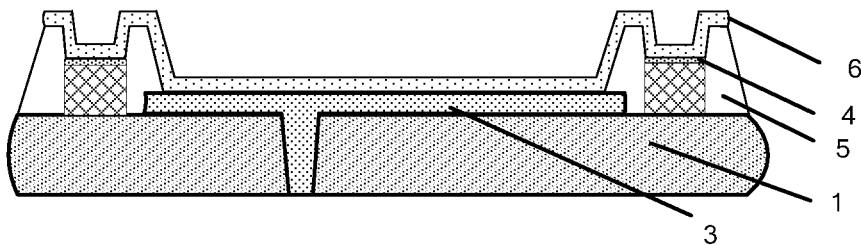
FIG. 3a is a schematic structural view illustrating the step of forming an organic light-emitting layer in the method for manufacturing the OLED device, provided by an embodiment of the present invention.
Figure 3B:
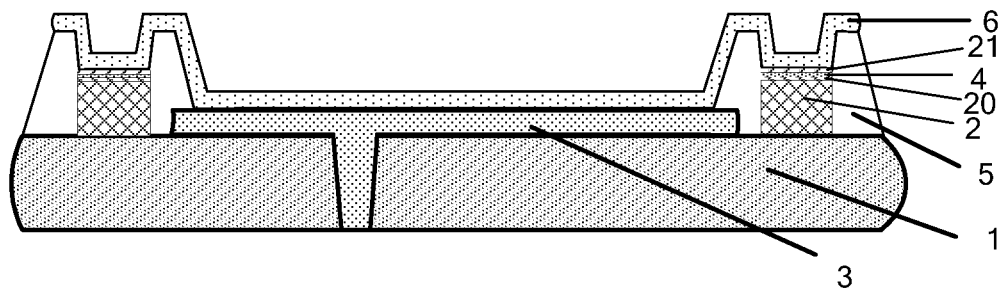
FIG. 3b is a schematic structural view illustrating the step of forming a buffer layer and/or a Photothermal conversion layer in the method for manufacturing the OLED device, provided by an embodiment of the present invention.

For instance, the method provided by the embodiment may further comprise: forming a photothermal conversion layer 20 between the auxiliary electrodes 2 and the gas generation layer 4, as shown in FIG. 3b.

For instance, the photothermal conversion layer 20 may be formed of a light-absorbing material. The material can absorb infrared light and most light in a visible region. The laser absorbing material may be an organic film, a metal oxide, a metal sulfide or any composition thereof.

For instance, the method provided by the embodiment may further comprise: forming a buffer layer 21 between the gas generation layer 4 and the organic light-emitting layer 6, as shown in FIG. 3b.

The buffer layer 21 may be configured to control the adhesion between the gas generation layer 4 and the organic light-emitting layer 6, so that the transfer can become easier. The buffer layer 21 may be formed of an organic matter or a metal oxide.

For instance, the method provided by the embodiment may further comprise: forming anodes 3 on the resin layer and forming a pixel defining layer (PDL) structure 5 provided with pixel regions and auxiliary electrode regions.

Figure 2:
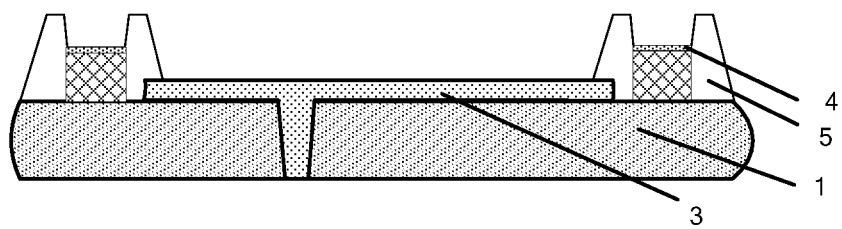
FIG. 2 is a schematic diagram illustrating the step of forming a PDL structure in the method for manufacturing the OLED device, provided by an embodiment of the present invention.

For instance, the method for manufacturing the OLED device may comprise: as illustrated in FIG. 1, forming anodes 3 and auxiliary electrodes 2 on a resin layer 1 of a TFT backplane by processes such as film forming, exposure, development and drying; forming a gas generation layer 4 on the auxiliary electrodes 2; and forming a PDL (e.g., bank-shaped) structure 5 (as shown in FIG. 2) provided with pixel regions and auxiliary electrode regions 22 simultaneously on the resin layer 1 by processes such as film forming, exposure, development and drying. For instance, the PDL structure 5 may be formed after the auxiliary electrodes 2 are formed and may also be formed before the auxiliary electrodes 2 are formed.

For instance, the process for forming the PDL structure 5 may include the following steps.

Firstly, a PDL film of the PDL structure is formed.

For instance, a photoresist film is formed on a surface of a substrate provided with an anode; the commonly used film forming methods include spin-coating, slit-coating or the like; the height of the PDL may be from 0.1 μm to 100 μm, preferably, from 1 to 5 μm; and the PDL may be made from a material such as resin, polyimide (PI), organosilicone, SiO2 or the like.

Secondly, exposure/development is performed.

In order to obtain the PDL structure in which the pixel regions and the auxiliary electrode regions are different, a half-tone technology may be adopted.

For instance, as illustrated in FIGS. 3a and 3b, the embodiment may further comprise: forming an organic light-emitting layer 6 on the anode and the PDL structure, and at the same time forming the organic light-emitting layer 6 on the gas generation layer. For instance, a typical organic light-emitting layer 6 includes one or more layers selected from a hole injection layer (HIL), a hole transport layer (HTL), an EML, a hole blocking layer (HBL), an electron blocking layer (EBL), an electron transport layer (ETL), an electron injection layer (EIL) and the like, or is a white-light-emitting structure formed by the series connection of a plurality of above units of the organic light-emitting layer.

Due to the difficulty of applying an FMM in the process of manufacturing a large-size OLED panel, a top-emission OLED device generally adopts a white organic light-emitting diode (WOLED) device structure, namely an organic light-emitting layer is evaporated on a PDL layer via an aperture mask.

Before the auxiliary electrodes 2, the anode 3 and the PDL structure 5 are formed, the method may further comprise the following steps: forming a gate electrode layer, a gate insulating layer, an etch barrier layer, a passivation layer and the resin layer on a glass substrate.

For instance, TFT patterns with the thickness of 1 μm-100 μm are formed on the glass substrate by repeated processes including film forming, exposure, etching and development. The commonly used film forming processes include sputtering, plasma enhanced chemical vapor deposition (PECVD), evaporation, spin-coating, knifing, printing, inkjet printing, etc.

For instance, the method provided by the embodiment may further comprise: forming the cathode 7 on the organic light-emitting layer, and at the same time forming the cathode 7 on the auxiliary electrodes 2.

Figure 5:
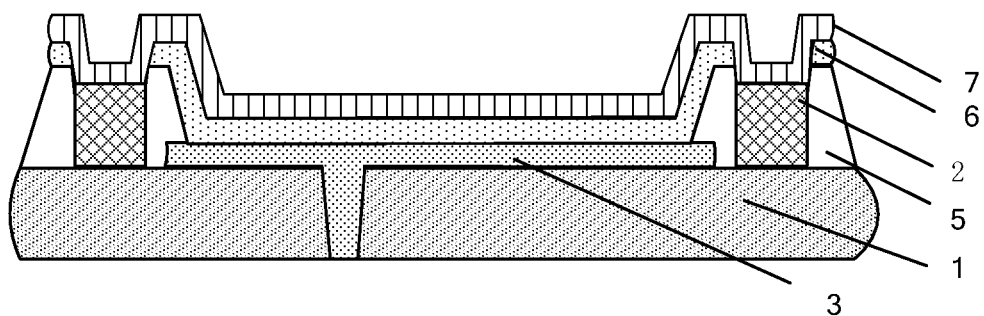
FIG. 5 is a schematic structural view illustrating the step of forming a cathode in the method for manufacturing the OLED device, provided by an embodiment of the present invention.

The cathode 7 is formed on the organic light-emitting layer. As illustrated in FIG. 5, the cathode 7 is a transparent electrode and preferably made from a transparent metal with good electric conductivity or an oxide thereof. The optional transparent electrode includes indium tin oxide (ITO), a metal in a thin thickness, grapheme, or the like or any combination of the above components.

Due to the difficulty of applying an FMM in the process of manufacturing a large-size OLED panel, a top-emission OLED device generally adopts a WOLED device structure, namely a cathode is evaporated on the organic light-emitting layer via an aperture mask, so that the structure of a planar cathode can be formed.

Due to the adoption of the aperture mask, apart from the deposition of the organic light-emitting layer and cathode metal in the pixel regions, the organic light-emitting layer and the cathode metal are also deposited in the auxiliary electrode regions. The auxiliary electrode regions may also be not deposited with the cathode metal.

Thirdly, the organic light-emitting layer in the auxiliary electrode regions is stripped off.

Figure 4:
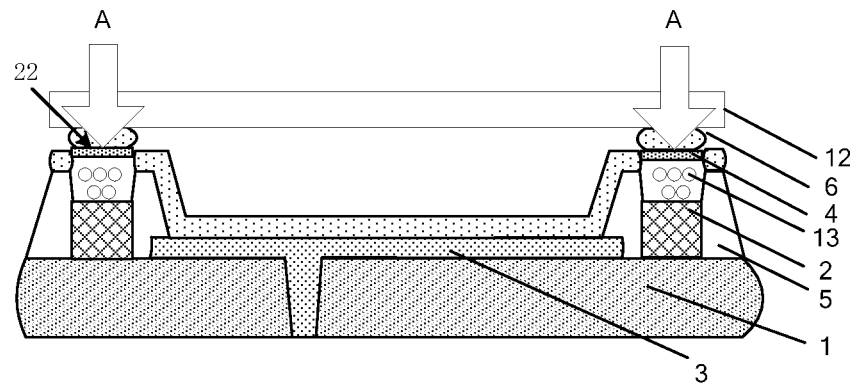
FIG. 4 is a schematic structural view illustrating the step of stripping off an organic light-emitting layer in auxiliary electrode regions in the method for manufacturing the OLED device, provided by an embodiment of the present invention.

As illustrated in FIG. 4, an appropriate receptor substrate 12 is placed on the organic light-emitting layer, and subsequently, the auxiliary electrode regions are scanned by laser A, so that the gas generation layer 4 is decomposed under the irradiation of the laser A to release gas 13, and hence the organic light-emitting layer in the auxiliary electrode regions is transferred to the receptor substrate 12.

Figure 6:
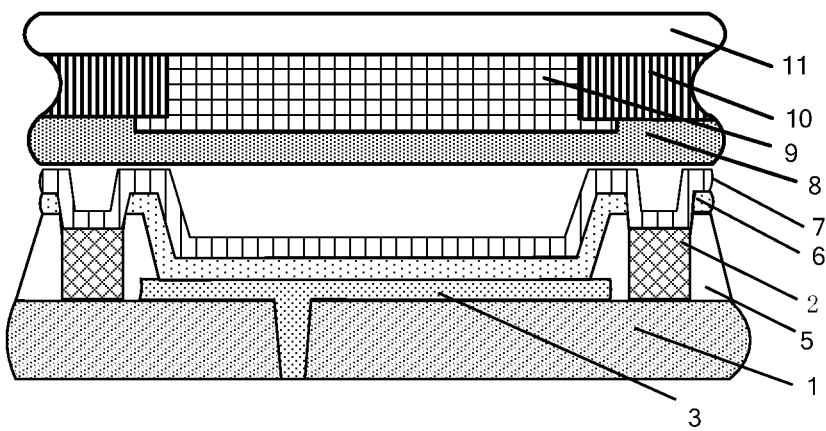
FIG. 6 is a schematic structural view illustrating the cell-assembly of a CF substrate and an OLED device in an embodiment of the present invention.

For instance, as illustrated in FIG. 6, the method provided by the embodiment may further comprise: forming black matrix 10, a color filter layer 9 (e.g., including R/G/B pixel units), and a planarization layer 8 on a glass substrate 11 by exposure and development processes; forming auxiliary electrodes on the planarization layer 8; and performing vacuum attachment after a CF substrate and an OLED substrate are accurately aligned.

The second embodiment of the present invention provides an OLED device, which is manufactured by any foregoing method.

The third embodiment of the present invention provides a display device, which comprises any foregoing OLED device.

The display devices include, but are not limited to, devices such as LCDs, LCD TVs and LCD screens and may also be display devices with display modules such as digital picture frames, e-paper, mobile phones, watches, tablet PCs, notebook computers and navigators.

The embodiment of the present invention adopts a new process for forming the auxiliary electrodes of the top-emission OLED device, can effectively reduce the poor contact between the auxiliary electrodes and the cathode and avoid the pixel defects, which are caused if residues produced after the organic materials are irradiated by laser or the cathode is melt are transferred into the pixel regions in the subsequent process, and hence can improve the display quality of luminescent devices and improve the product yield.

The foregoing is only the preferred embodiments of the present invention and not intended to limit the scope of protection of the present invention. The scope of protection of the present invention should be defined by the appended claims.

The application claims priority to the Chinese patent application No. 201410469986.7, filed on Sep. 15, 2014, the disclosure of which is incorporated herein by reference as part of the application.

The invention claimed is:

1. A method for manufacturing an organic light-emitting diode (OLED) device, comprising:
    forming auxiliary electrodes on a resin layer of an OLED substrate;
    forming a gas generation layer on the auxiliary electrodes;
    forming an organic light-emitting layer on the gas generation layer;
    placing a receptor substrate on the organic light-emitting layer and scanning auxiliary electrode regions by laser, so that the gas generation layer is decomposed under laser irradiation to release gas, and hence the organic light-emitting layer in the auxiliary electrode regions is transferred to the receptor substrate;
    removing the receptor substrate; and
    forming a cathode on the auxiliary electrodes.

2. The method according to claim 1, wherein the gas generation layer is made of a material capable of releasing gas under laser excitation.

3. The method according to claim 2, wherein the material capable of releasing the gas comprises gallium nitride (GaN), aluminum nitride (AlN), pentaerythritol tetranitrate (PETN) or trinitrotoluene (TNT).

4. The method according to claim 1, wherein a thickness of the gas generation layer is from 10 nm to 100 μm.

5. The method according to claim 4, wherein a thickness of the gas generation layer is from 200 to 500 nm.

6. The method according to claim 1, further comprising: forming a photothermal conversion layer between the auxiliary electrodes and the gas generation layer.

7. The method according to claim 6, wherein the photothermal conversion layer is formed of a light-absorbing material.

8. The method according to claim 7, wherein the light-absorbing material comprises an organic film, a metal oxide, a metal sulfide or any composition thereof.

9. The method according to claim 1, further comprising:
    forming a buffer layer between the gas generation layer and the organic light-emitting layer, in which the buffer layer is configured to control the adhesion between the gas generation layer and the organic light-emitting layer.

10. The method according to claim 9, wherein the buffer layer is formed of an organic matter or a metal oxide.

11. The method according to claim 1, further comprising:
    forming an anode on the resin layer and forming a pixel define layer (PDL) structure provided with pixel regions and the auxiliary electrode regions.

12. The method according to claim 11, wherein
    the PDL structure is formed before the auxiliary electrodes are formed, or the PDL structure is formed after the auxiliary electrodes are formed.

13. The method according to claim 11, further comprising:
    forming the organic light-emitting layer on the anode and the PDL structure and at the same time forming the organic light-emitting layer on the gas generation layer.

14. The method according to claim 11, before the auxiliary electrodes, the anode and the PDL structure are formed, further comprising:
    forming gate electrodes, a gate insulating layer, active layers, an etch barrier layer, a passivation layer and the resin layer on a glass substrate.

15. The method according to claim 1, further comprising:
    forming the cathode on the organic light-emitting layer and at the same time forming the cathode on the auxiliary electrodes.

16. An organic light-emitting diode (OLED) device manufactured by the method according to claim 1.

17. A display device, comprising the OLED device according to claim 16.

18. The method according to claim 12, further comprising:
    forming the organic light-emitting layer on the anode and the PDL structure and at the same time forming the organic light-emitting layer on the gas generation layer.

19. The method according to claim 9, further comprising:
    forming an anode on the resin layer and forming a pixel define layer (PDL) structure provided with pixel regions and the auxiliary electrode regions.

20. The method according to claim 9, further comprising:
    forming the cathode on the organic light-emitting layer and at the same time forming the cathode on the auxiliary electrodes.

* * * * *